US008551252B2

(12) United States Patent
Fresco

(10) Patent No.: US 8,551,252 B2
(45) Date of Patent: Oct. 8, 2013

(54) METHODS FOR REMOVING RESIDUAL PARTICLES FROM A SUBSTRATE

(75) Inventor: Zachary Fresco, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 870 days.

(21) Appl. No.: 12/062,439

(22) Filed: Apr. 3, 2008

(65) Prior Publication Data
US 2009/0250078 A1    Oct. 8, 2009

(51) Int. Cl.
*B08B 7/00* (2006.01)
*B08B 3/00* (2006.01)

(52) U.S. Cl.
USPC ........... 134/4; 134/7; 134/26; 134/27; 134/28

(58) Field of Classification Search
USPC ........................................ 134/4, 7, 26, 27, 28
See application file for complete search history.

(56) References Cited

U.S. PATENT DOCUMENTS

| 6,152,148 | A * | 11/2000 | George et al. ...................... 134/2 |
| 6,443,812 | B1 * | 9/2002 | Costas et al. ...................... 451/41 |
| 6,641,899 | B1 * | 11/2003 | Colburn et al. ............... 428/209 |
| 2003/0139059 | A1 * | 7/2003 | Andreas ......................... 438/745 |
| 2004/0084059 | A1 * | 5/2004 | Xia et al. ......................... 134/1.3 |
| 2006/0261434 | A1 * | 11/2006 | Lazovsky et al. ............. 257/499 |
| 2007/0166989 | A1 * | 7/2007 | Fresco et al. .................. 438/597 |
| 2008/0076688 | A1 * | 3/2008 | Barnes et al. ................. 510/175 |

OTHER PUBLICATIONS

Office Action Response for U.S. Appl. No. 11/647,882, filed Oct. 12, 2009

* cited by examiner

*Primary Examiner* — Michael Kornakov
*Assistant Examiner* — Katelyn Whatley

(57) ABSTRACT

Methods for removing residual particles from a substrate are presented including: receiving the substrate including the residual particles; and functionalizing the residual particles with functionalizing molecules, wherein the functionalizing molecules selectively attach with a surface the residual particles, where the functionalizing molecules impart a changed chemical characteristic to the residual particles, and where the changed chemical characteristic facilitates removal of the residual particles from the substrate. In some embodiments, methods further include: before functionalizing, cleaning the substrate, where the cleaning leaves residual particles adhered with a surface of the substrate, and where the residual particles are hydrophilic; and if the surface of the substrate is hydrophobic, performing the functionalizing. In some embodiments, methods further include removing the residual particles from the surface of the substrate where removing the residual particles includes removing the functionalizing molecules.

15 Claims, 4 Drawing Sheets

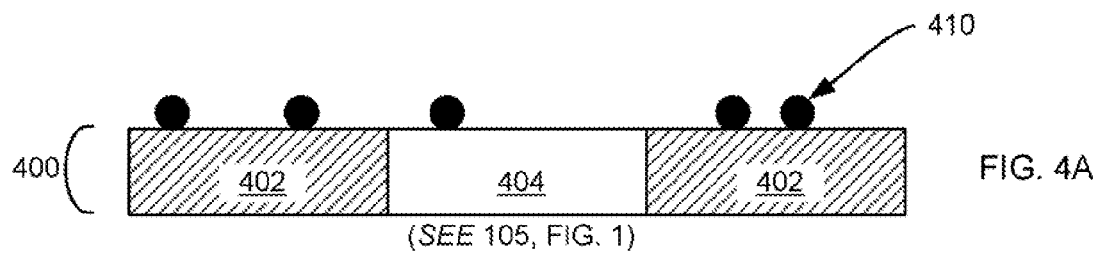
(SEE 105, FIG. 1)   FIG. 4A
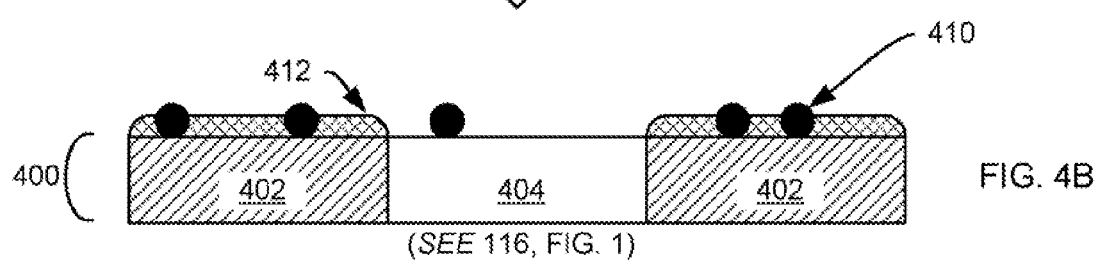
(SEE 116, FIG. 1)   FIG. 4B
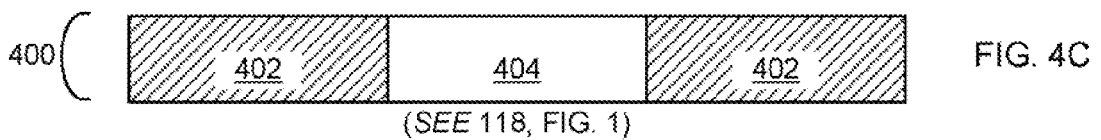
(SEE 118, FIG. 1)   FIG. 4C

METHODS FOR REMOVING RESIDUAL PARTICLES FROM A SUBSTRATE

CROSS REFERENCE TO RELATED APPLICATIONS

The present invention is related to the following applications, all of which are incorporated herein by reference:

Commonly assigned application U.S. patent application Ser. No. 11/647,882, now issued as U.S. Pat. No. 7,879,710, entitled "SUBSTRATE PROCESSING INCLUDING A MASKING LAYER," filed on Dec. 29, 2006, by the same inventors herein.

BACKGROUND

Semiconductor manufacturing has long required exacting processes to achieve reproducible results. Clean room techniques have been developed and rigorously enforced because any source of contamination may quickly destroy a manufacturing run. However, not all sources of contamination can be prevented from the application of clean room techniques. Indeed, some manufacturing processes are inherently contaminating. For those processes, new procedures and techniques must be developed to reduce or eliminate harmful contaminants in sale and effective manners.

For example, chemical mechanical polishing or planarization (CMP) is one technique used in semiconductor fabrication for planarizing a top surface of an in-process semiconductor wafer or other substrate. CMP processes utilize abrasive and corrosive chemical slurries (commonly a colloid) in conjunction with a polishing pad and retaining ring, typically of a greater diameter than the wafer. The pad and wafer are pressed together by a dynamic polishing head and held in place by a plastic retaining ring. The dynamic polishing head is rotated with different axes of rotation (i.e., not concentric). This process removes material and tends to even out any irregular topography, making the water more or less flat or planar. A CMP step may be necessary, in some devices, to set up a wafer for the formation of additional circuit elements. CMP is considered a "dirty" process because of the introduction of slurry particles to the manufacturing environment. To combat contamination, chemical cleaning processes have teen developed which attempt to clear a substrate of all slurry particles before additional processing takes place.

However, in some examples utilizing CMP processes, slurry particles may resist chemical cleaning (i.e., remain on the surface of the substrate) and may, therefore, adversely affect further processing of substrates. Such slurry particles, which often comprise silica particles, may themselves be hydrophilic. When a surface of the substrate is hydrophobic, and therefore has a high wetting angle, hydrophilic slurry particles may be inaccessible to cleaning solutions, and may, therefore, remain adhered to the substrate after a post-CMP cleaning step. In addition, adhered slurry may provide nucleation sites for complexes formed from post-cleaning process chemistries. In other examples, where slurry particles are characteristically hydrophobic, attachment to a surface may render a device surface less reactive with desired aqueous chemistries. As may be appreciated, particulate contamination may have many undesirable effects. As such, methods for removing residual particles from a substrate are presented herein.

BRIEF DESCRIPTION OF THE DRAWINGS

The present invention is illustrated by way of example, and not by way of limitation, in the figures of the accompanying drawings and in which like reference numerals refer to similar elements and in which;

FIGS. 4A-C are illustrative diagrammatic representation of selectively normalizing a portion of a substrate and removing particles from a substrate in accordance with embodiments of the present invention.

DETAILED DESCRIPTION

The present invention will now be described in detail with reference to a few embodiments thereof as illustrated in the accompanying drawings. In the following description, numerous specific details are set forth in order to provide a thorough understanding of the present invention, it will be apparent, however, to one skilled in the art, that, the present invention may be practiced without some or all of these specific details. In other instances, well known process steps and/or structures have not been described in detail in order to not unnecessarily obscure the present invention.

Figure 1:
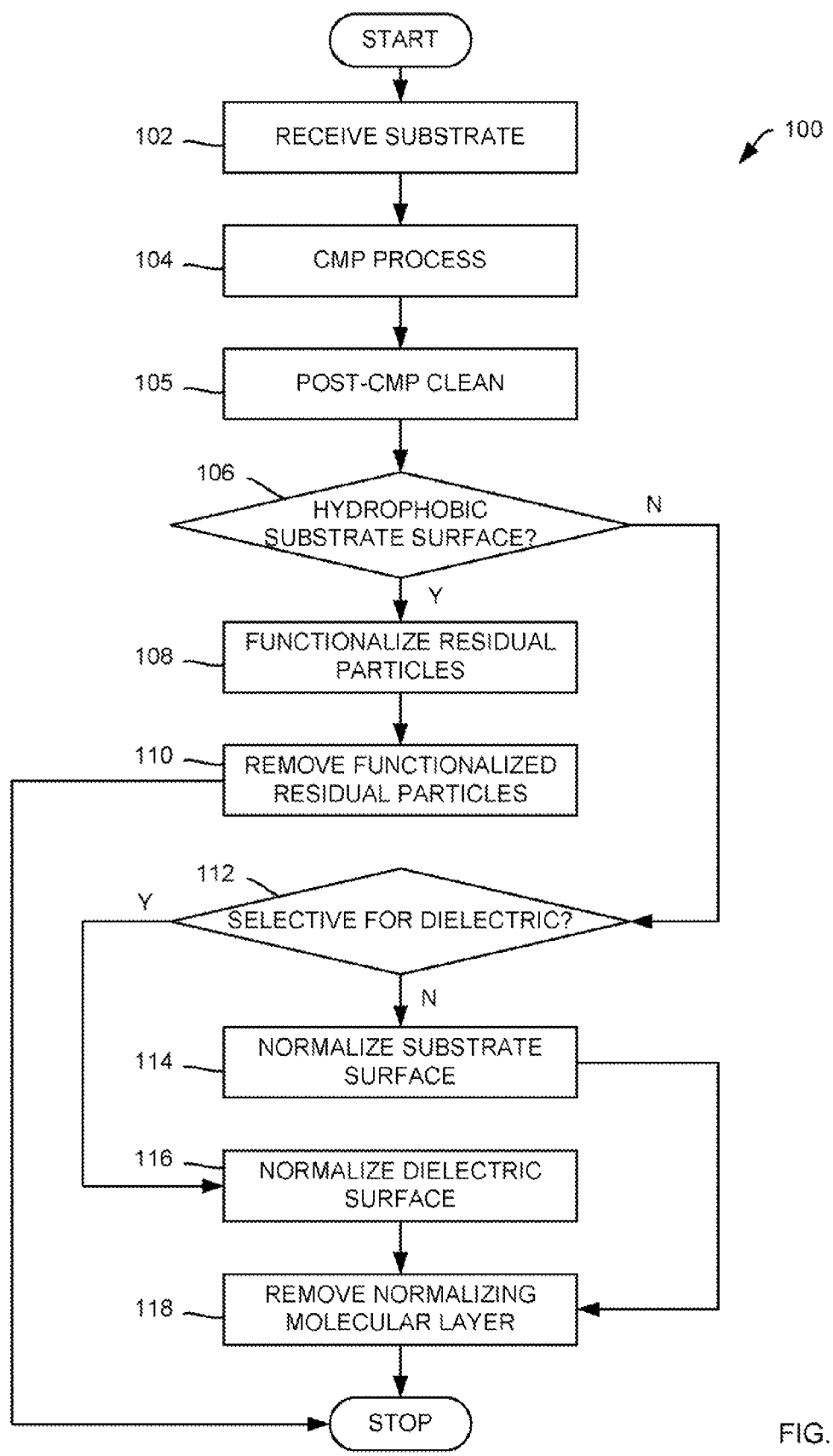
FIG. 1 is an illustrative flowchart of methods for removing residual particles from a substrate in accordance with embodiments of the present invention.

FIG. 1 is an illustrative flowchart 100 of methods for removing residual particles from a substrate in accordance with embodiments of the present invention. At a first step 102, the method receives a substrate. A substrate, as contemplated herein, may include a dielectric region, a conductive region, or any combination thereof. In some embodiments, dielectric regions may be composed of hydrophilic dielectric material including: $SiO_2$, SiCNH, SiCOH, SiN, and porous SiCOH. In some embodiments, dielectric regions may be composed of hydrophobic dielectric material including: SiC, SiCH, SiCN, $SiCH_3$, and low-κ dielectric material. As may be appreciated, hydrophilic materials are typically defined as having a contact angle of less than approximately 60 degrees. Hydrophobic materials are typically defined as having a contact angle of greater than approximately 60 degrees, in some embodiments, conductive regions may be composed of Cu, Al, W, Cu alloys, Al alloys, W alloys, and combinations thereof. In addition, dielectric regions may be characteristically hydrophobic or hydrophilic without departing from the present invention. At a next step 104, the method processes the substrate by a chemical mechanical polishing (CMP) process. CMP processes are generally well-known in the art and may include any number of techniques or process chemistries without departing from the present invention. For example, CMP can be used for planarizing metallization in back-end-of-line (BEOL) processing. Importantly, in some instances, for which embodiments of the present invention are well-suited, utilizing CMP processes may result in residual particle adhesion with a surface of a substrate. Residual particles may remain adhered even after post-CMP cleans. These residual particles, as noted above, may adversely affect further processing of substrates. In embodiments, residual particles may include slurry particles that include silica particles, alumina particles, and ceria particles. In addition, in embodiments, residual particles may include metal particles from the conductive regions (e.g., Cu particles).

At a next step 105, the method performs a post-CMP clean. A post-CMP clean is intended to remove all residues from a substrate after a CMP process step. However, as noted above, at least some residual particles may remain after a post-CMP clean, thus necessitating additional treatment. Any post-CMP clean process known in the art may be performed without departing from the present invention. At a next step 106, the method determines whether a substrate surface is hydrophobic. It may be appreciated that substrates may be characteristically hydrophobic or hydrophilic to varying degrees. Subsequent processes may, in some examples, be selected to account for these characteristics. If the method determines at a step 106 that a substrate is hydrophobic, the method continues to a step 108 to functionalize residual particles adhered to the substrate to be hydrophilic and therefore soluble in an aqueous cleaning solution that can easily be removed from the hydrophobic substrate. Functionalizing residual particles is the process of selectively attaching functionalizing molecules to surfaces of the residual particles. In some embodiments, a chemical characteristic of residual particles may be adjusted or changed to some degree through functionalization. For example, a solubility change or a zeta potential change may be accomplished by functionalizing residual particles. In embodiments where residual particles are slurry particles, functionalizing molecules may include; amines, alcohols, alcoxysilanes, chlorosilanes, aminosilanes, silanols, thiols. In some embodiments, the silanols include compounds having the formula: R—X—$SiOH_3$, where R is a hydrophilic group having a formula $O(C_2H_4O)_mCH_3$, where m=an integer greater than zero; and where X is an organic group having a formula $(CH_2)_n$, where n=an integer greater than zero. In addition, in some embodiments, the aminosilanes include a dimethylaminosilane (DMA) of the formula $C_n$—Si-DMA, where n is an integer. In some embodiments, n is equal to: 4, 8, 12, and 18. In embodiments where residual particles are metal particles, functionalizing molecules may include: thiols, dithiocarbamates, amines, and carboxylic acids.

After residual particles are functionalized at a step 108, the method continues to a step 110 to remove the functionalized residual particles. As noted above, functionalizing molecules may impart a change in the chemical characteristics of residual particles to facilitate the removal of the functionalized residual particles. As such, a functionalized residual particle may be more or less soluble for a desired aqueous cleaning solution. The functionalized residual particles may then be removed by a cleaning solution in which the functionalized residual particles are soluble. As may be appreciated, removing functionalized residual particles includes removing functionalizing molecules that are attached with the residual particles. Removing functionalized residual particles may be accomplished using any cleaning solution well-known in the art without departing from the present invention.

Functionalizing of only the residual particles is useful when residual particles are substantially different from a surface to which the residual particles are attached as, for example, when residual particles are hydrophilic and substrate surfaces are hydrophobic. This is because the functionalization of the residual particles can be selective to the residual particles, thus allowing for removal of only the functionalized residual particles using the appropriate cleaning solution based on the chemical characteristics imparted by the functionalization. In contrast, there may be instances where the residual particles are not substantially different from a surface to which the residual particles are attached. In these instances it may be useful to normalize the surface and the residual particles. Normalizing includes attaching functionalizing molecules to both substrate surfaces and to attached residual particles to form a (normalizing molecular layer) NML. Normalizing is useful when residual particles are not substantially different from a surface to which the residual particles are attached as, for example, when residual particles are hydrophilic and substrate surfaces are also hydrophilic.

Normalization of the surface may be valuable if the method determines that, a substrate surface is not hydrophobic at a step 106. The method continues to a step 112 to determine whether to selectively normalize only a dielectric region of the substrate. In embodiments, it may be desirable to normalize only dielectric regions of a substrate as, for example, when a subsequent process is intended to react with conductive regions. In addition to providing mechanisms for removing attached particles, an NML may serve a secondary purpose. That is, to protect dielectric regions during a subsequent process. If the method determines to selectively normalize only a dielectric region of the substrate at a step 112, the method continues to a step 116 to normalize a dielectric surface with functionalizing molecules to form an NML.

If the method determines not to selectively normalize only a dielectric region of the substrate at a step 112, the method continues to a step 114 to normalize both dielectric regions and conductive regions of the substrate surface with functionalizing molecules to form an NML. As noted above, in embodiments where residual particles are slurry particles, functionalizing molecules may include: amines, alcohols, alcoxysilanes, chlorosilanes, aminosilanes, silanols, thiols. In some embodiments, the silanols include compounds having the formula: R—X—$SiOH_3$, where R is a hydrophilic group having a formula $O(C_2H_4O)_mCH_3$, where m=an integer greater than zero; and where X is an organic group having a formula $(CH_2)_n$, where n=an integer greater than zero. In addition, in some embodiments, the aminosilanes include a dimethylaminosilane (DMA) of the formula $C_n$—Si-DMA, where n is an integer. In some embodiments, n is equal to: 4, 8, 12, and 18. In embodiments where residual particles are metal particles, functionalizing molecules may include: thiols, dithiocarbamates, amines, and carboxylic acids.

Normalizing both the substrate surface and the residual particles may result in a change of a chemical characteristic of the substrate surface and the residual particles. For example, in embodiments, a solubility change or a zeta potential change may be accomplished by normalizing substrate surfaces and attached residual particles. The method continues to a step 118 to remove an NML from all surfaces. In embodiments, removing the NML from all surfaces also removes the residual particles adhered to the substrate surface.

Figure 2A:
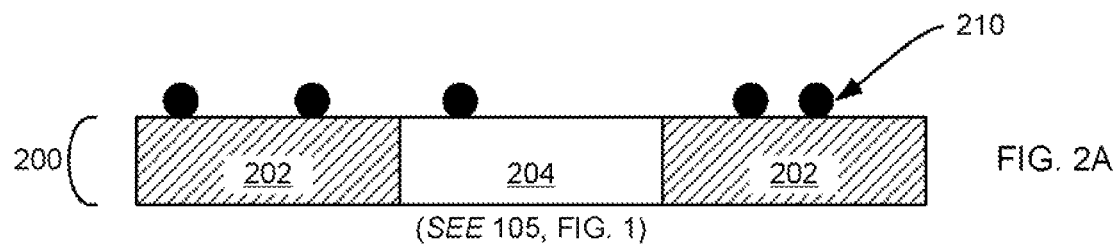
FIGS. 2A-C are illustrative diagrammatic representation of functionalizing and removing particles from a substrate in accordance with embodiments of the present invention.

FIG. 2A illustrates a substrate 200 having residual particles 210 which have adhered with substrate 200 surfaces. In particular, FIG. 2A illustrates an example of a substrate after a post-CMP clean step as in a step 105 (FIG. 1). As illustrated, for FIG. 2A, substrate 200 includes dielectric regions 202 and conductive regions 204. Substrates, as contemplated herein, may include any number of dielectric regions and conductive regions without limitation. These regions may include interleaving to a greater or lesser extent without limitation. Substrate 200 includes residual particles 210 that may have adhered with dielectric and conductive surfaces.

Figure 2B:
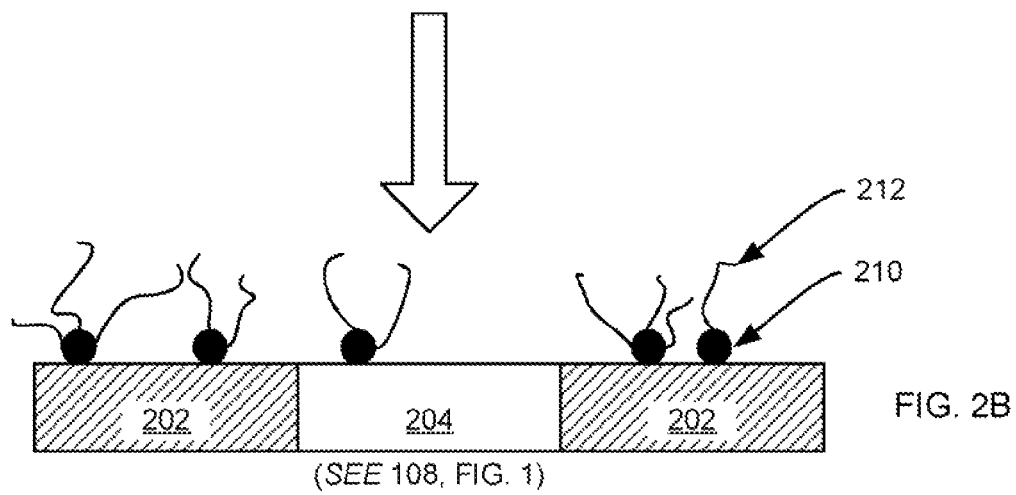

FIG. 2B illustrates a substrate 200 having residual particles 210 which have been functionalized with functionalizing molecules 212. In particular, FIG. 2B illustrates an example of a substrate after a functionalization step as in a step 108 (FIG. 1). As noted above, functionalizing residual particles is the process of selectively attaching functionalizing molecules with surfaces of the residual particles. In some examples, a substrate may be very hydrophobic. In those examples, the hydrophobic characteristic of the substrate may impede or altogether prevent functionalizing molecules from reaching residual particles. In some embodiments, a polyvinyl alcohol (PVA) layer may be utilized to improve wettability of the substrate and therefore may allow functionalizing molecules access to residual particles. In embodiments where residual particles are slurry particles, functionalizing molecules may include: amines, alcohols, alcoxysilanes, chlorosilanes, aminosilanes, silanols, thiols. In some embodiments, the silanols include compounds having the formula: R—X—SiOH$_3$, where R is a hydrophilic group having a formula O(C$_2$H$_4$O)$_m$CH$_3$, where m=an integer greater than zero; and where X is an organic group having a formula (CH$_2$)$_n$, where n=an integer greater than zero. In addition, in some embodiments, the aminosilanes include a dimethylaminosilane (DMA) of the formula C$_a$—Si-DMA, where n is an integer. In some embodiments, n is equal to: 4, 8, 12, and 18. In embodiments where residual particles are metal particles, functionalizing molecules may include: thiols, dithiocarbamates, amines, and carboxylic acids.

Figure 2C:
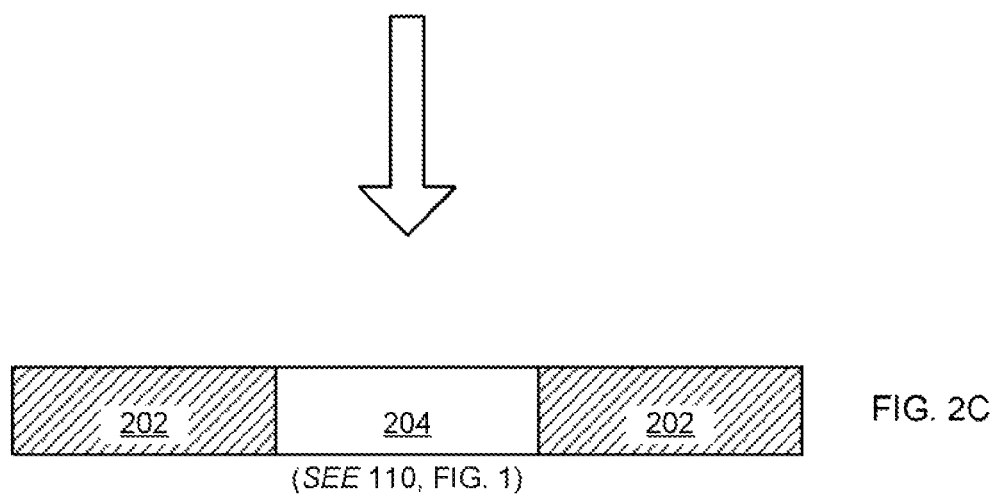

FIG. 2C illustrates a substrate 200 with substantially no residual particles. In particular, FIG. 2C illustrates an example of a substrate after a cleaning step as in a step 110 (FIG. 1). As noted above, in functionalizing residual particles, a chemical characteristic of the residual particles may be adjusted or changed to some degree. For example, in embodiments, a solubility change and a zeta potential change may be accomplished by functionalizing residual particles. Thus, a hydrophilic residual particle may be functionalized to alter solubility in preparation for a subsequent process (e.g. an aqueous cleaning process) using embodiments described herein. In some embodiments, increasing solubility of residual particles allows for removal of those residual particles in an aqueous cleaning process. As may be appreciated, removing functionalized residual particles includes removing functionalizing molecules that are attached with the residual particles.

Figure 3A:
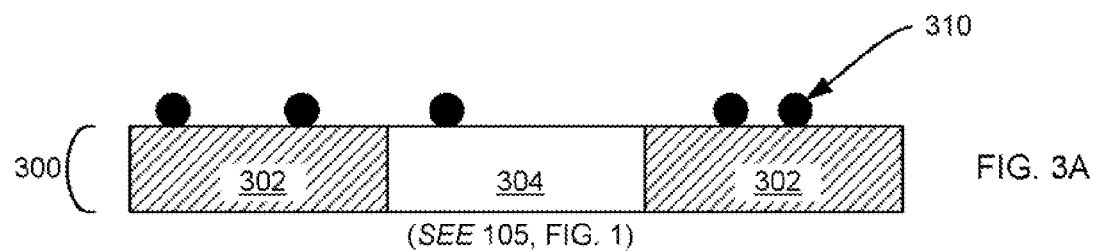
FIGS. 3A-C are illustrative diagrammatic representation of non-selectively normalizing a substrate and removing particles from a substrate in accordance with embodiments of the present, invention.

FIG. 3A illustrates a substrate 300 having residual particles 310 which have adhered with substrate 300 surfaces. In particular, FIG. 3A illustrates an example of a substrate after a post-CMP clean step as in a step 105 (FIG. 1). As illustrated, for FIG. 3A, substrate 300 includes dielectric regions 302 and conductive regions 304. Substrates, as contemplated herein, may include any number of dielectric regions and conductive regions without, limitation. These regions may include interleaving to a greater or lesser extent without limitation. Substrate 300 includes residual particles 310 that may have adhered with dielectric and conductive surfaces.

Figure 3B:
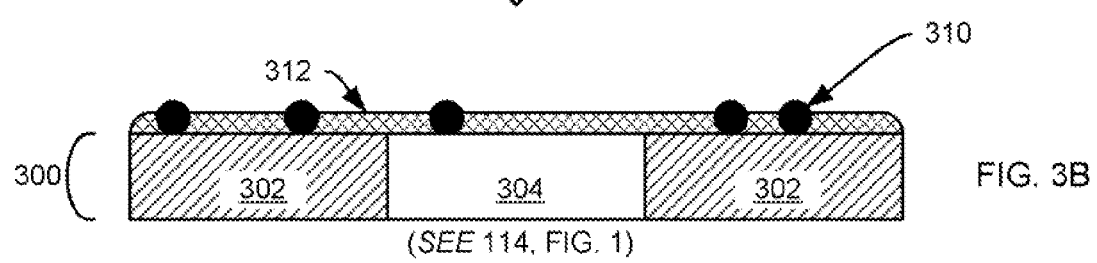

FIG. 3B illustrates a substrate 300 having residual particles 310 where substrate surfaces have been normalized with functionalizing molecules 312.

In particular, FIG. 3B illustrates an example of a substrate alter a normalization step as in a step 114 (FIG. 1). As noted above, normalizing includes attaching functionalizing molecules with substrate surfaces and attached residual particles thereby forming an NML such that residual particles are at least partially encapsulated by the NML. In some embodiments, the depth of an NML is substantially smaller than a corresponding diameter of residual particles. In some examples, a substrate may be very hydrophobic. In those examples, the hydrophobic characteristic of the substrate may impede or altogether prevent functionalizing molecules from reaching residual particles. In some embodiments, a polyvinyl alcohol (PVA) layer may be utilized to improve wettability of the substrate and therefore may allow functionalizing molecules access to residual particles. In embodiments where residual particles are slurry particles, functionalizing molecules may include: amines, alcohols, alcoxysilanes, chlorosilanes, aminosilanes, silanols, thiols. In some embodiments, the silanols include compounds having the formula: R—X—SiOH$_3$, where R is a hydrophilic group having a formula O(C$_2$H$_4$O)$_m$CH$_3$, where m=an integer greater than zero; and where X is an organic group having a formula (CH$_2$)$_n$, where n=an integer greater than zero. In addition, in some embodiments, the aminosilanes include a dimethylaminosilane (DMA) of the formula C$_n$—Si-DMA, where n is an integer. In some embodiments, n is equal to: 4, 8, 12, and 18. In embodiments where residual particles are metal particles, functionalizing molecules may include: thiols, dithiocarbamates, amines, and carboxylic acids.

Figure 3C:
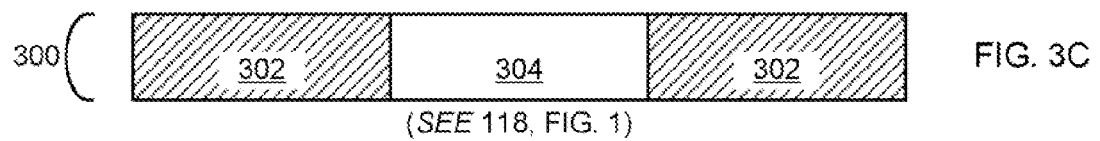

FIG. 3C illustrates a substrate 300 with substantially no residual particles. In particular, FIG. 3C illustrates an example of a substrate after a cleaning step as in a step 118 (FIG. 1). As above, in normalizing a substrate surface and attached residual particles may result in a change of a chemical characteristic of the substrate surface and attached residual particles. For example, in embodiments, a solubility change and a zeta potential change may be accomplished by normalizing a substrate surface and attached residual particles. Thus, hydrophilic substrate surfaces and residual particles may be normalized to alter solubility in preparation for a subsequent process (e.g. an aqueous cleaning process) embodiments described herein. In some embodiments, increasing solubility of residual particles allows for removal of those particles in an aqueous cleaning process. As may be appreciated, removing attached residual particles includes removing the NML that partially encapsulates the residual particles.

FIG. 4A illustrates a substrate 400 having residual particles 410 which have adhered with substrate 400 surfaces. In particular, FIG. 4A illustrates an example of a substrate after a post-CMP clean step as in a step 105 (FIG. 1). As illustrated, for FIG. 4A, substrate 400 includes dielectric regions 402 and conductive regions 404. Substrates, as contemplated herein, may include any number of dielectric regions and conductive regions without limitation. These regions may include interleaving to a greater or lesser extent without limitation. Substrate 400 includes residual particles 410 that may be adhered to dielectric and conductive surfaces.

FIG. 4B illustrates a substrate 400 having residual particles 410 where dielectric region 402 surfaces have been selectively normalized with functionalizing molecules 412. Functionalizing molecules may form a selective NML in some embodiments. In particular, FIG. 4B illustrates an example of a substrate after a selective normalization step as in a step 116 (FIG. 1). Selectively normalizing a substrate includes attaching functionalizing molecules both with dielectric region surfaces and with attached residual particles thereby forming an NML such that residual particles are at least partially encapsulated by the NML. In some embodiments, the depth of an NML is substantially smaller than a corresponding diameter of residual particles. In embodiments where residual particles are slurry particles, functionalizing molecules may include: amines, alcohols, alcoxysilanes, chlorosilanes, aminosilanes, silanols, thiols. In some embodiments, the silanols include compounds having the formula; R—X—SiOH$_3$, where R is a hydrophilic group having a formula O(C$_2$H$_4$O)$_m$CH$_3$, where m=an integer greater than zero; and where X is an organic group having a formula (CH$_2$)$_n$, where n=an integer greater than zero. In addition, in some embodiments, the aminosilanes include a dimethylaminosilane (DMA) of the formula C$_n$—Si-DMA, where n is an integer. In some embodiments, n is equal to: 4, 8, 12, and 18. In embodiments where residual particles are metal particles, functionalizing molecules may include; thiols, dithiocarbamates, amines, and carboxylic acids.

FIG. 4C illustrates a substrate 400 with substantially no residual particles. In particular, FIG. 4C illustrates an example of a substrate after a cleaning step as in a step 118 (FIG. 1). As above, in selectively normalizing a substrate surface and attached residual particles may result in a change of a chemical characteristic of the substrate surface and attached residual particles. For example, in embodiments, a solubility change and a zeta potential change may be accomplished by selectively normalizing substrate surfaces and residual particles. Thus, a hydrophilic substrate surfaces and residual particles may be normalized to alter solubility in preparation for a subsequent process (e.g. an aqueous cleaning process) using embodiments described herein. In some embodiments, increasing solubility of residual particles allows for removal of those particles in an aqueous cleaning process. As may be appreciated, removing attached residual particles includes removing the NML that partially encapsulates the residual particles.

Embodiments described herein may be utilized in the processing of any type of semiconductor substrate, such as, for example, a silicon substrate, silicon-on-insulator substrate, silicon carbide substrate, strained silicon substrate, silicon germanium substrate or gallium arsenide substrate. Further, embodiments may be utilized in the processing of a substrate of any shape or size. For example, the embodiments may be utilized in the processing of semiconductor substrates utilized in the production of electronic components, which substrates are typically circular, as well as in the processing of substrates utilized in the production of flat panel displays, which substrates are typically rectangular. The embodiments may be utilized in the processing of small semiconductor substrates having areas of less than one (1) square inch up to the 12 inch (300 mm) semiconductor substrates currently utilized in the production of many electronic components; in general, there is no limit to the size of substrate that may be processed, so that the embodiments may be utilized to process each succeeding larger generation of semiconductor substrates utilized to produce electronic components. The embodiments may also be utilized to process the relatively large substrates that are utilized in the production of flat panel displays (now, commonly rectangular substrates on the order of about one (1) square meter (m), but, in some cases, larger, and expected to increase in size in the future).

Still further, substrates processed utilizing embodiments described herein may be and incorporated into any number of electronic devices including semiconductor devices, optoelectronic devices, data storage devices, magnetoelectronic devices, magnetooptic devices, molecular electronic devices, photovoltaic devices (e.g., solar cells), flat panel displays, MEMS, electroluminescent devices, photoluminescent devices, photonic devices, and packaged devices.

While this invention has been described In terms of several embodiments, there are alterations, permutations, and equivalents, which fall within the scope of this invention. It should also be noted that there are many alternative ways of implementing the methods and apparatuses of the present invention. Furthermore, unless explicitly stated, any method embodiments described herein are not constrained to a particular order or sequence. Further, the Abstract is provided herein for convenience and should not be employed to construe or limit the overall invention, which is expressed in the claims. It is therefore intended that the following appended claims be interpreted as including all such alterations, permutations, and equivalents as fall within the true spirit and scope of the present invention.

What is claimed is:

1. A method for removing a plurality of residual slurry particles from a substrate, the method comprising:
   receiving the substrate, the substrate having the plurality of residual slurry particles remaining on a surface of the substrate after a chemical mechanical planarization (CMP) process;
   determining whether surface characteristics of the substrate are substantially different than surface characteristics of the residual slurry particles;
   if the surface characteristics of the substrate are substantially different than surface characteristics of the residual slurry particles, then the method includes,
   selectively attaching to a surface of the plurality of residual slurry particles a functionalizing molecule, wherein the functionalizing molecule imparts at least one changed chemical characteristic to the plurality of residual slurry particles relative to the surface of the substrate, and wherein the at least one changed chemical characteristic facilitates removal of the plurality of residual slurry particles from the substrate;
   if the surface characteristics of the substrate are not substantially different than the surface characteristics of the residual slurry particles, then the method includes,
   attaching a normalizing molecular layer (NML) to both the surface of the substrate and the residual slurry particles; and
   cleaning the substrate after one of the selectively attaching the functionalizing molecule or the attaching the NML with an aqueous cleaning solution.

2. The method of claim 1, wherein the slurry particles are selected from the group consisting of: silica particles, alumina particles, and ceria particles.

3. The method of claim 1, wherein the functionalizing molecule is a compound selected from the group consisting of: amines, alcohols, alcoxysilanes, chlorosilanes, aminosilanes, silanols, dithiocarbamates, carboxylic acids and thiols.

4. The method of claim 1, wherein the functionalizing molecule comprises aminosilanes having a formula $C_n$—Si-DMA, wherein n is an integer selected from the group consisting of: 4, 8, 12, and 18.

5. The method of claim 1, wherein the functionalizing molecule comprises silanols having a formula:
R—X—$SiOH_3$ wherein
R is a hydrophilic group having a formula $O(C_2H_4O)_m$ $CH_3$, wherein m=an integer greater than zero; and wherein
X is an organic group having a formula $(CH_2)_n$, wherein n=an integer greater than zero.

6. The method of claim 1, wherein the cleaning of the substrate with the aqueous solution causes removal of the plurality of residual slurry particles from the surface of the substrate during the cleaning, and wherein removing the plurality of residual slurry particles includes removing the functionalizing molecules when the surface characteristics of the substrate are substantially different than surface characteristics of the residual slurry particles and removing the plurality of residual slurry particles includes removing the NML when the surface characteristics of the substrate are not substantially different than the surface characteristics of the residual slurry particles.

7. The method of claim 1, wherein the determining includes determining whether the surface characteristics of the substrate is one of hydrophilic or hydrophobic and determining whether the surface characteristics of the residual slurry particles is one of hydrophilic or hydrophobic, wherein when the surface characteristics of the substrate are not substantially different than the surface characteristics of the residual slurry particles, the plurality of residual slurry particles are at least partially encapsulated by the NML; and the plurality of residual slurry particles are removed with the NML during the cleaning.

8. The method of claim 1, wherein the at least one changed chemical characteristic is selected from the group consisting of: a solubility change and a zeta potential change.

9. The method of claim 1, wherein the cleaning is a post-chemical mechanical polishing clean.

10. The method of claim 1, wherein the substrate includes a dielectric region and a conductive region.

11. The method of claim 10, wherein the dielectric region is composed of a hydrophilic dielectric material selected from the group consisting of $SiO_2$, SiCNH, SiCOH, SiN, and porous SiCOH.

12. The method of claim 10, wherein the dielectric region is composed of a hydrophobic dielectric material selected from the group consisting of: SiC, SiCH, SiCN, $SiCH_3$, and low-κ dielectric material.

13. A method for removing a plurality of residual particles from a substrate, the method comprising:

receiving the substrate, the substrate having the plurality of residual particles remaining on a surface of the substrate after a chemical mechanical planarization (CMP, process;

determining whether surface characteristics of the substrate are substantially different than surface characteristics of the residual particles;

if the surface characteristics of the substrate are substantially different than surface characteristics of the residual particles, then the method includes, selectively attaching to a surface of the plurality of residual particles a functionalizing molecule, wherein the functionalizing molecule imparts at least one changed chemical characteristic to the plurality of residual particles relative to the surface of the substrate, and wherein the at least one changed chemical characteristic facilitates removal of the plurality of residual particles from the substrate;

if the surface characteristics of the substrate are not substantially different than the surface characteristics of the residual particles, then the method includes, attaching a normalizing molecular layer (NML) to both the surface of the substrate and the residual particles; and removing the plurality of residual particles from the surface of the substrate with an aqueous cleaning solution, wherein removing the plurality of residual particles includes removing the functionalizing molecules when the surface characteristics of the substrate are substantially different than surface characteristics of the residual particles and removing the plurality of residual particles includes removing the NML when the surface characteristics of the substrate are not substantially different than the surface characteristics of the residual particles.

14. The method of claim 13, wherein when the surface characteristics of the substrate are substantially different than surface characteristics of the residual slurry particles and the residual particles are slurry particles, the functionalizing molecule includes a compound selected from the group consisting of: amines, alcohols, alcoxysilanes, chlorosilanes, aminosilanes, silanols, and thiols.

15. The method of claim 14, wherein when the surface characteristics of the substrate are substantially different than surface characteristics of the residual slurry particles and the residual particles are metal particles, the functionalizing molecule includes a compound selected from the group consisting of: thiols, dithiocarbamates, amines, and carboxylic acids.

* * * * *